(12) United States Patent
Kirsch

(10) Patent No.: US 7,133,998 B2
(45) Date of Patent: Nov. 7, 2006

(54) ACTIVE MEMORY PROCESSING ARRAY TOPOGRAPHY AND METHOD

(75) Inventor: Graham Kirsch, Tadley (GB)

(73) Assignee: Micron Technology, Inc., Boise, ID (US)

( * ) Notice: Subject to any disclaimer, the term of this patent is extended or adjusted under 35 U.S.C. 154(b) by 477 days.

(21) Appl. No.: 10/629,382

(22) Filed: Jul. 28, 2003

(65) Prior Publication Data

US 2004/0193842 A1 Sep. 30, 2004

(30) Foreign Application Priority Data

Mar. 31, 2003 (GB) ................................ 0307454.9

(51) Int. Cl.
*G06F 9/00* (2006.01)
(52) U.S. Cl. ........................................................ 712/13
(58) Field of Classification Search ................ 712/13; 711/100
See application file for complete search history.

(56) References Cited

U.S. PATENT DOCUMENTS

| | | | |
|---|---|---|---|
| 4,800,383 A | | 1/1989 | Considine .............. 340/825.79 |
| 5,552,722 A | * | 9/1996 | Kean ............................. 326/41 |
| 5,689,661 A | * | 11/1997 | Hayashi et al. .............. 710/316 |
| 5,737,628 A | * | 4/1998 | Birrittella et al. .............. 712/11 |
| 6,470,441 B1 | * | 10/2002 | Pechanek et al. ............. 712/15 |
| 6,598,145 B1 | * | 7/2003 | Dally et al. ...................... 712/1 |
| 6,728,862 B1 | * | 4/2004 | Wilson ......................... 712/14 |
| 6,769,056 B1 | * | 7/2004 | Barry et al. ................... 712/15 |

FOREIGN PATENT DOCUMENTS

| | | |
|---|---|---|
| EP | 0 444 368 A1 | 9/1991 |
| GB | 2 276 743 A | 10/1994 |

* cited by examiner

*Primary Examiner*—Eric Coleman
(74) *Attorney, Agent, or Firm*—Dorsey & Whitney LLP

(57) ABSTRACT

An integrated active memory device includes an array of processing elements coupled to a dynamic random access memory device and to a component supplying instructions to the processing elements. The processing elements are logically arranged in a plurality of logical rows and logical columns. The array is logically folded to minimize the length of the longest path between processing elements by physically interleaving the processing elements so that the processing elements in different logical rows a physically interleaved with each other and the processing elements in different logical columns a physically interleaved with each other.

26 Claims, 4 Drawing Sheets

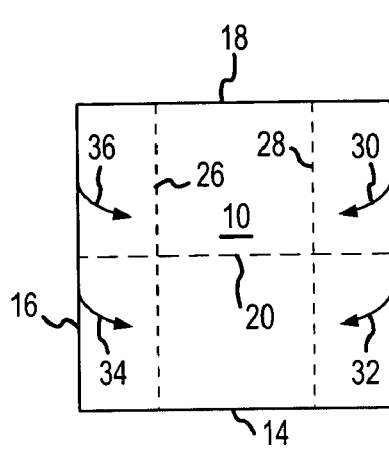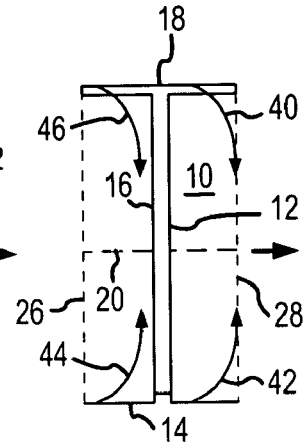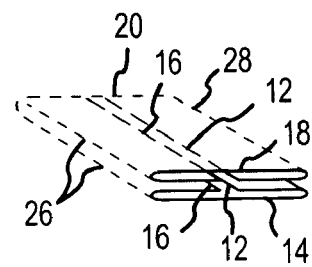
FIG.1A  FIG.1B  FIG.1C
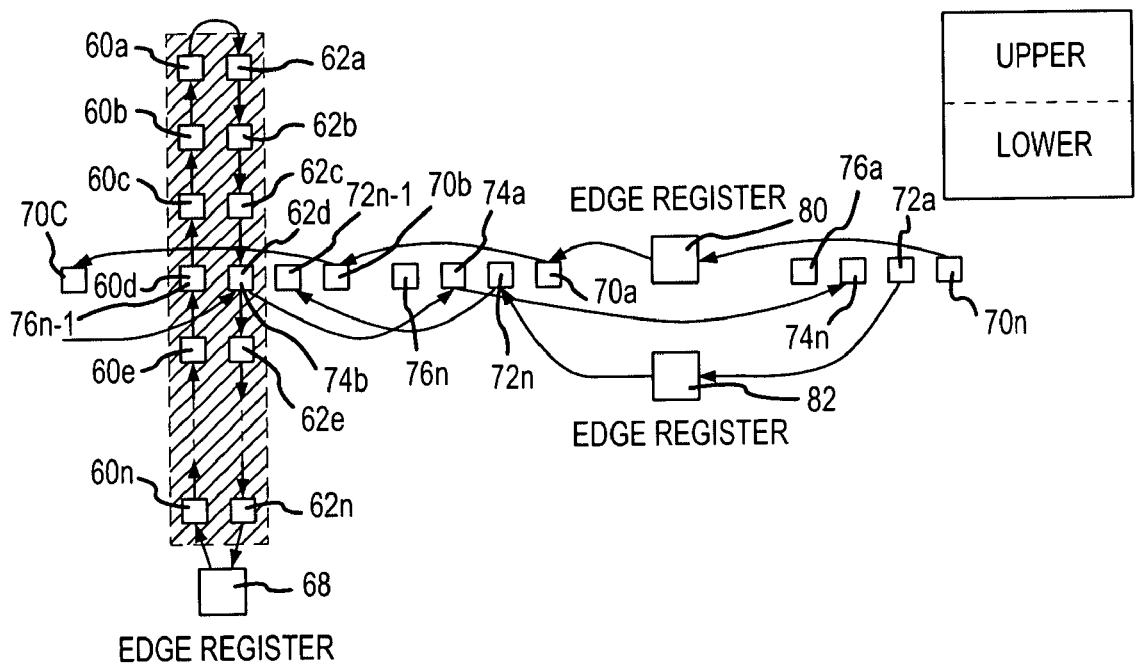
FIG.2

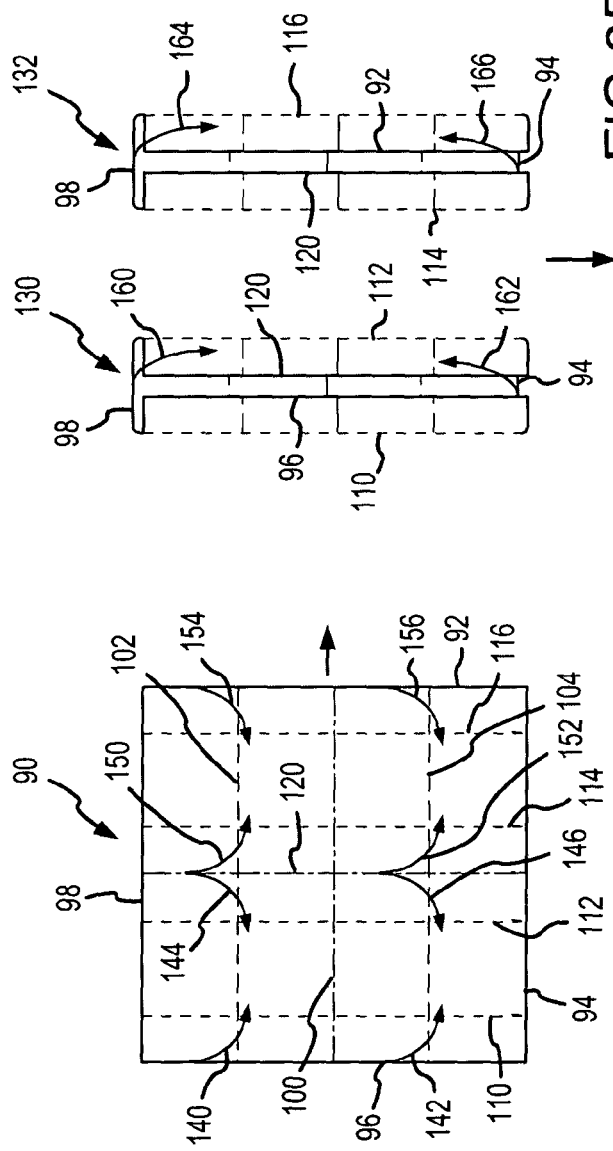
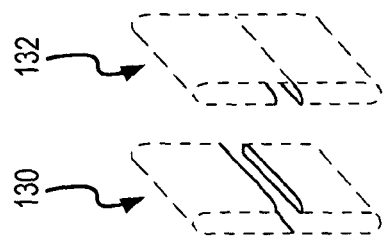
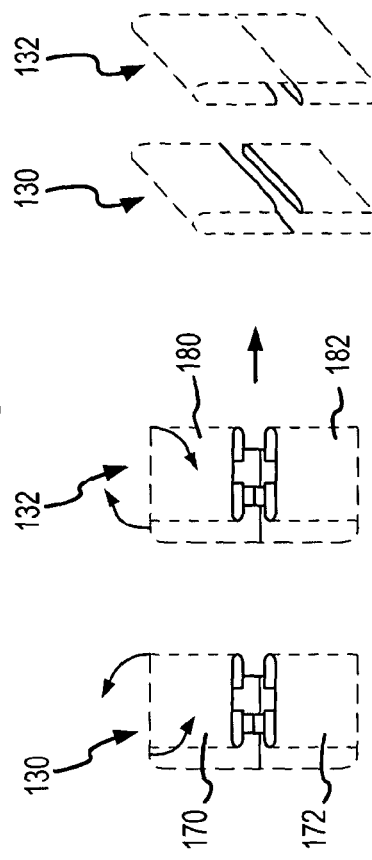

ACTIVE MEMORY PROCESSING ARRAY TOPOGRAPHY AND METHOD

TECHNICAL FIELD

The invention relates memory devices, and, more particularly, to a processing element array for an active memory device having a topography that minimizes the maximum length of the longest processing element interconnection path.

BACKGROUND OF THE INVENTION

A common computer processing task involves sequentially processing large numbers of data items, such as data corresponding to each of a large number of pixels in an array. Processing data in this manner normally requires fetching each item of data from a memory device, performing a mathematical or logical calculation on that data, and then returning the processed data to the memory device. Performing such processing tasks at high speed is greatly facilitated by a high data bandwidth between the processor and the memory device. The data bandwidth between a processor and a memory device is proportional to the width of a data path between the processor and the memory device and the frequency at which the data are clocked between the processor and the memory device. Therefore, increasing either of these parameters will increase the data bandwidth between the processor and memory device, and hence the rate at which data can be processed.

A memory device having its own processing resource is known as an active memory. Conventional active memory devices have been provided for mainframe computers in the form of discrete memory devices having dedicated processing resources. However, it is now possible to fabricate a memory device, particularly a dynamic random access memory ("DRAM") device, and one or more processors on a single integrated circuit chip. Single chip active memories have several advantageous properties. First, the data path between the DRAM device and the processor can be made very wide to provide a high data bandwidth between the DRAM device and the processor. In contrast, the data path between a discrete DRAM device and a processor is normally limited by constraints on the size of external data buses. Further, because the DRAM device and the processor are on the same chip, the speed at which data can be clocked between the DRAM device and the processor can be relatively high, which also maximizes data bandwidth. The cost of an active memory fabricated on a single chip can is also less than the cost of a discrete memory device coupled to an external processor.

An active memory device can be designed to operate at a very high speed by parallel processing data using a large number of processing elements ("PEs") each of which processes a respective group of the data bits. One type of parallel processor is known as a single instruction, multiple data ("SIMD") processor. In a SIMD processor, each of a large number of PEs simultaneously receive the same instructions, but they each process separate data. The instructions are generally provided to the PE's by a suitable device, such as a microprocessor. The advantages of SIMD processing are simple control, efficient use of available data bandwidth, and minimal logic hardware overhead. The number of PE's included on a single chip active memory can be very large, thereby resulting in a massively parallel processor capable of processing large amounts of data.

A common operation in active memory SIMD processing element arrays is the shifting of an array of data. To facilitate this operation, processing elements in the array are preferably connected to each other by data paths that permit neighboring processing elements to transfer data between each other. For example, in a two-dimensional rectangular array, each processing element may be connected to its four nearest neighbors. To maximize the operating speed of the processing element array, it is desirable to minimizes the data path between processing elements. Doing so does not present a problem in the interior of the array because neighboring processing elements can be placed very close to each other. However, at the edges of the array, the path from a processing element at one edge of the array to a processing element at the opposite edge of the array (which are neighbors to each other) can be very large.

One conventional technique that has been used to minimize the length of the longest path between processing elements can be explained with reference to FIGS. 1A–C, which show a technique for folding paper that can be analogized to "folding" an array of processing elements. As shown in FIG. 1A, a rectangular piece of paper 10 representing a logical array of processing elements has edges 12, 14, 16, 18, a horizontal fold line 20, and two vertical fold lines 26, 28. The paper 10 is initially folded about the vertical fold lines 26, 28 as shown by the arrows 30, 32, 34, 36 in FIG. 1A. After being folded in this manner, the paper has the configuration shown in FIG. 1B. In this configuration, the vertical edges 12, 16 are positioned close to each other at the center of the paper 10. As a result, the distance between the vertical edges 12, 16 is relatively small, and the distances between the vertical edges 12, 16 and other portions of the paper 10 are also reduced.

The paper 10 is next folded along the horizontal line 20 as shown by the arrows 40, 42, 44, 46 in FIG. 1B, which results in the configuration shown in FIG. 1C. In this configuration, the horizontal edges 18, 14 are positioned adjacent each other, as are the upper and lower portions of the vertical edges 12, 16.

It is, of course, not possible to fold a semiconductor substrate on which processing elements are fabricated in the manner in which the paper 10 can be folded as shown in FIGS. 1A–C. However, a similar effect can be achieved by spacing processing elements apart from each other so that processing elements on "overlapping" portions of the substrate can be interleaved with each other. For example, with reference to FIG. 1B, the processing elements between the vertical fold lines 26, 28 are spread out by one processing element. Processing elements in the substrate between the vertical fold line 26 and the vertical edge 16 and between the vertical fold line 28 and the vertical edge 12 are then positioned between the processing elements in the substrate between the fold lines 26, 28.

When the substrate is "folded" as shown in FIG. 1C, the processing elements are again interleaved. However, since there is now four layers of "substrate," the processing elements extending from one side of the folded substrate shown in FIG. 1C must be interleaved by 3 processing elements. Since processing elements that are logically adjacent to each other before "folding" are now physically separated from each other by three processing elements, processing element interconnections are coupled to every fourth processing element.

When an array of processing elements are conceptually "folded" as shown in FIG. 1C, it can still be logically accessed as if it was in its unfolded configuration shown in FIG. 1A. When folded as shown in FIG. 1C, the array has physical topography shown in FIG. 2, which, in the interest of clarity, shows only some of the processing elements in the array. FIG. 2 also shows the physically location of registers 50, 52, 56, 58 that are positioned adjacent the edges 12, 14, 16, 18, respectively, of the array. When the array is folded about the horizontal line 20 as shown in FIG. 1B, processing elements 60a–n logically positioned below the line 20 are physically to the left of processing elements 62a–n logically positioned above the line 20 as shown in FIG. 2. The connections between the processing elements 62 logically positioned above the line and the processing elements 60 logically positioned below the line are physically connected to each other at the top, as shown in FIG. 2. The processing element 60a at the logical bottom of the array and the processing element 62a at the logical top of the array are positioned adjacent a common edge register 68. However, a separate edge register may be provided for the processing elements 60 logically positioned below the line 20 and a separate edge register may be provided for the processing elements 62 logically positioned above the line 20. In either case, at least one edge register 68 is provided for each column of the array.

As explained in greater detail below, FIG. 2 also shows a first row of processing elements 70a–c,n logically below the line 20, a first row of processing elements 72n,n–1, a logically above the line 20, a second row of processing elements 74a–c,n logically above the line 20, and a second row of processing elements 76a–c logically above the line 20 (the processing element 62d is also labeled 74b, and the processing element 60d is also labeled 76n–1). However, the processing elements 70, 74 are actually in the same logical row above the line 20, and the processing elements 72, 76 are in the same logical row below the line 20. The processing elements 70 logically extend rightwardly from the left edge of the logical array, and the processing elements 72 logically extend leftwardly from the right edge of the logical array.

A left edge register 80 physically positioned at the center of the physical array is logically positioned at the left edge of the logical array, i.e., adjacent the line 16, three processing elements above the line 20. A right edge register 82 is also physically positioned at the center of the substrate but is logically positioned at the right edge of the logical array, i.e., adjacent the line 12. The left edge register 80 is coupled to a processing element 70a, which, in turn is coupled to a processing element 70b. The logical position of the processing element 70a is at the left edge of the logical array, i.e., adjacent the line 16, three processing elements above the line 20, and the logical position of the processing element 70b is one processing element to the right of the left edge, three processing elements above the line 20. The processing elements to which the registers 80, 82 are coupled are in different logical rows.

Similarly, the right edge register 82 is shown coupled to the processing elements 72a,n,n–1. The processing element 72a is one processing element to the left of the right edge of the logical array, three processing elements below the line 20. The processing element 72n is at the center of the logical array, and the processing element 72n–1 is to the right adjacent the processing element 72n, and both are logically positioned three processing elements below the horizontal line 20.

The concept illustrated in FIG. 1 and the topography shown in FIG. 2 has the advantage of minimizing the length of the longest path between processing elements. However, the topography shown in FIG. 2 has the disadvantage of making it difficult to perform operations using only a portion of an array of processing elements. For example, performing operations using only the processing elements logically positioned in the upper left quadrant shown in FIG. 1 involves processing elements that are physically spread throughout the substrate. More specifically, the processing elements logically in the upper left quartile are interleaved with the processing elements in the lower left quartile, and they are in rows that are interleaved with processing elements in the upper and lower right quartiles.

Therefore, a need exists for a processing array topography that minimizes the length of the longest path between processing elements in an array, but does so in a manner that facilities either partial or full use of the array.

SUMMARY OF THE INVENTION

An array of processing elements, which may be included in an active memory device, are logically arranged in a rectangular grid of logical rows and logical columns so that which each processing element lies in only one logical row and one logical column. The processing elements in the array are divided into four sub-arrays each of which includes the processing elements in a respective quartile of the logical array. The processing elements in each of the sub-arrays are physically positioned in a folded arrangement. In this folded arrangement, the processing elements in different logical rows are physically interleaved with each other, and the processing elements in different logical columns are physically interleaved with each other. The processing elements in the array are coupled to each other by a system of conductors to allow data to be shifted from one processing element to a logically adjacent processing element.

BRIEF DESCRIPTION OF THE DRAWINGS

FIGS. 1A–C are diagrams illustrating a prior art concept for minimizing the length of the longest path between processing elements in an array of processing elements.

FIG. 2 is a block diagram illustrating a topography for an array of processing elements using the concept illustrated in FIGS. 1A–C.

FIGS. 3A–D are diagrams illustrating a topography for minimizing the length of the longest path between processing elements in an array of processing elements according to one embodiment of the invention.

DETAILED DESCRIPTION OF THE INVENTION

Figure 4:
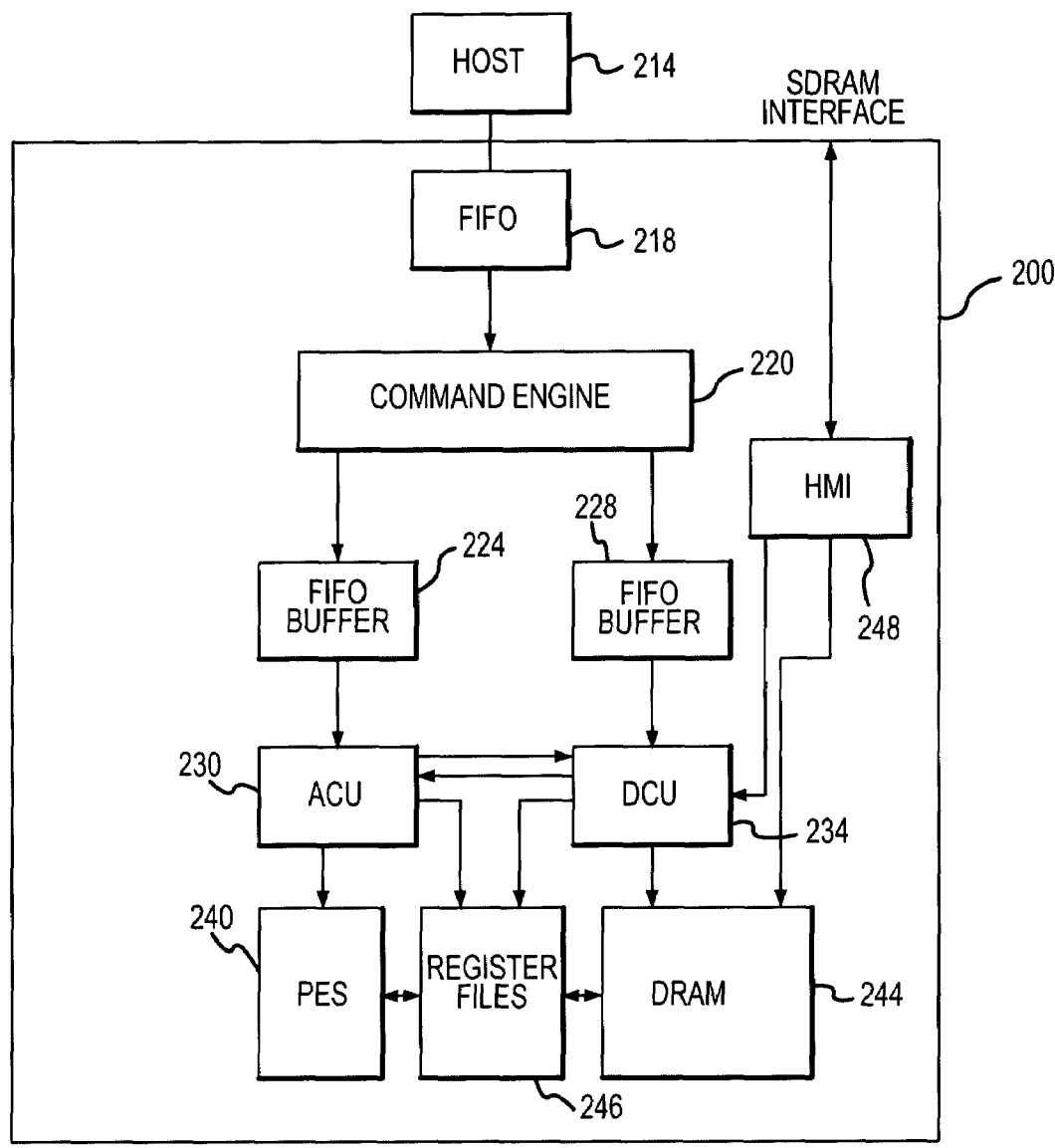
FIG. 4 is a block diagram of an active memory device having an array of processing elements using the array topography illustrated in FIG. 3D.

FIGS. 3A–D illustrate the concept of a topography for an array of processing elements according to one embodiment of the invention in the same manner that FIGS. 1A–C illustrate the prior art topography for an array of processing elements. As shown in FIG. 3A, a piece of paper representing a logical array 90 of processing elements includes four edges 92, 94, 96, 98, one horizontal line 100 dividing the logical array 90 in two, two horizontal fold lines 102, 104, four vertical fold lines 110, 112, 114, 116, and a vertical divide line 120.

With reference also to FIG. 3B, the logical array 90 is severed into two array sections 130, 132 along the divide line 120, and each section 130, 132 is then individually folded. The logical array section 130 is folded about the vertical fold lines 110, 112 as shown by the arrows 140, 142, 144, 146 in FIG. 3A, and the logical array section 132 is folded about the vertical fold lines 114, 116 as shown by the arrows 150, 152, 154, 156 in FIG. 3A. Finally, each folded logical array section 130, 132 is folded as shown by the arrows 160, 162 and 164, 166, respectively, in FIG. 3B to produce the configuration shown in FIG. 3C. The array sections 130, 132 shown in FIG. 3C are then positioned adjacent each other as shown in FIG. 3D.

Each of the array sections 130, 132 includes two sub-arrays 170, 172 and 180, 182, respectively, that have essentially the same topography as the topography shown in FIGS. 1A–C and 2. Significantly, each sub-array 170, 172, 180, 182 can operate independently because the processing elements in each of the sub-arrays 170, 172, 180, 182 are not interleaved with the processing elements in any of the other sub-arrays 170, 172, 180, 182. However, since the sub-arrays 170, 172 and 180, 182 in each of the array sections 130, 132, respectively, adjoin each other at the horizontal line 100, they can easily be interconnected to operate together. Further, since the array section 130 is positioned adjacent the array section 132, the sub-arrays 170, 172, 180, 182 can be interconnected with each other to operate together. Further, when the array sections 130, 132 are positioned as shown in FIG. 3D, the upper and lower edges 94, 98 of the logical array 90 are all positioned closely adjacent each other. As a result, the length of the paths between processing elements both within each sub-array 170, 172, 180, 182 and between the sub-arrays 170, 172, 180, 182 are relatively short. In one embodiment of the invention, the logical array 90 includes 1024 processing elements so that each sub-array 170, 172, 180, 182 includes 256 processing elements.

FIG. 4 shows an active memory device 200 using a processing array topography according to one embodiment of the invention. The memory device 200 is coupled to a host 214, such as a microprocessor, although it may be coupled to other devices that supply high level instructions to the memory device 200. The memory device 200 includes a first in, first out ("FIFO") buffer 218 that receives high level tasks from the host 214. Each task includes a task command and may include a task address. The received task commands are buffered by the FIFO buffer 218 and passed to a command engine 220 at the proper time and in the order in which they are received. The command engine 220 generates respective sequences of commands corresponding to received task commands. These commands are at a lower level than the task commands received by the command engine 220. The commands are coupled from the command engine 220 to either a first FIFO buffer 224 or a second FIFO buffer 228 depending upon whether the commands are array processing commands or memory commands. If the commands are array processing commands, they are passed to the FIFO buffer 224 and then to a processing array control unit ("ACU") 230. If the commands are memory commands, they are passed to the FIFO buffer 228 and then to a DRAM Control Unit ("DCU") 234.

The ACU 230 executes an intrinsic routine containing several microinstructions responsive to each command from the FIFO buffer 224, and these microinstructions are executed by an array of PEs 240. The PEs preferably operate as SIME processors in which all of the PEs 240 receive and simultaneously execute the same instructions, but they do so on different data or operands. However, the PEs may also operate as multiple instruction, multiple data ("MIMD") processors or some other type of processors. In the embodiment shown in FIG. 4, there are 1024 PEs 240 arranged in 4 sub-arrays of 256 PEs 240 each using the topography illustrated in FIG. 3D. Each of the PEs 240 is coupled to receive 8 bits of data from the DRAM 244 through register files 246. In the embodiment shown in FIG. 4, the DRAM 244 stores 16M bytes of data. However, it should be understood that the number of PEs 240 used in the active memory device 200 can be greater or lesser than 1024, and the storage capacity of the DRAM 244 can be greater or lesser than 16 Mbytes. Each of the sub-arrays 170, 172, 180, 182 preferably interfaces with its own register file 246 and its own interface to the DRAM 244. Although not shown in FIG. 4, each processing array section 130, 132 preferably has its own DRAM 244.

In operation, different intrinsic routines containing different microinstructions are issued by the ACU 230 for different commands received from the FIFO buffer 224. The DCU 234 issues memory commands and addresses responsive to commands from the FIFO buffer 224. In response, data are either read from a DRAM 244 and transferred to the register files 246, or written to the DRAM 244 from the register files 246. The register files 246 are also available to the PEs 240. The ACU 230 and the DCU 234 are coupled to each other so the operation of each of them can be synchronized to the other. The ACU 230 and DCU 234 are also coupled directly to the register files 246 so that they can control the operation and timing of data transfers between the register files 246 and both the PEs 240 and the DRAM 244.

With further reference to FIG. 4, the DRAM 244 may also be accessed by the host 214 directly through a host/memory interface ("HMI") port 248. The HMI port 248 receives commands that are substantially similar to the commands received by a conventional SDRAM except that signals for performing a "handshaking" function with the host 214 may also be provided. These commands include, for example, ACTIVE, DEACTIVATE, READ, WRITE, etc. In the embodiment shown in FIG. 4, the HMI port 248 includes a 32-bit data bus and a 14-bit address bus, which is capable of addressing 16,384 pages of 256 words. The address mapping mode is configurable to allow data to be accessed as 8, 16 or 32 bit words.

In a typical processing task, data read from the DRAM 244 are stored in the register files 246. The data stored in the register files 246 are then transferred to the PEs 240 where they become one or more operands for processing by the PEs 240. Groups of data bits read from or written to each set of DRAM columns are processed by respective PEs 240. The data resulting from the processing are then transferred from the PEs 240 and stored in the register files 246. Finally, the results data stored in the register files 246 are written to the DRAM 244.

The PEs 240 operate in synchronism with a processor clock signal (not shown in FIG. 4). The number of processor clock cycles required to perform a task will depend upon the nature of the task and the number of operands that must be fetched and then stored to complete the task. In the embodiment of FIG. 4, DRAM operations, such as writing data to and reading data from the DRAM 244, requires about 16 processor clock cycles. Therefore, for example, if a task requires transferring three operands into and of the DRAM 244, the task will require a minimum of 48 cycles.

Figure 5:
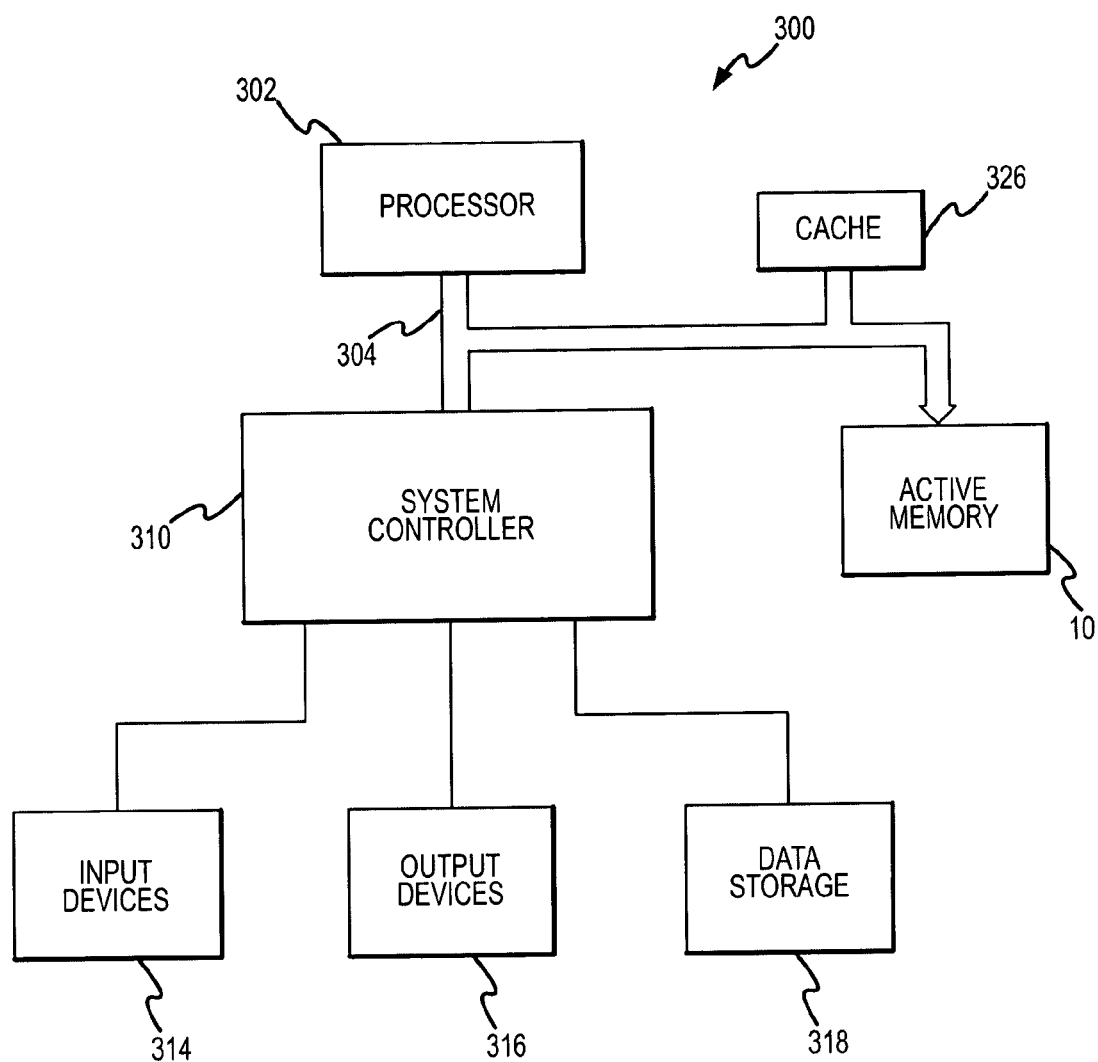
FIG. 5 is a block diagram of a computer system using the active memory device of FIG. 4.

A computer system 300 using the active memory device 200 of FIG. 4 or some other active memory device having a processing element array topography according to the present invention is shown in FIG. 5. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 through a system controller 310 to allow an operator to interface with the computer system 300. Typically, the computer system 300 also includes one or more output devices 316 coupled to the processor 302 through the system controller 310, such output devices typically being a printer or a video terminal. One or more data storage devices 318 are also typically coupled to the processor 302 through the system controller 310 to store data or retrieve data from external storage media (not shown). Examples of typical storage devices 318 include hard and floppy disks, tape cassettes, and compact disk read-only memories (CD-ROMs). The processor 302 is also typically coupled to a cache memory 326, which is usually static random access memory ("SRAM"). The processor 302 is also coupled through the data bus of the processor bus 304 to the active memory device 200 so that the processor 302 can act as a host 214, as explained above with reference to FIG. 4.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An integrated circuit active memory device comprising:
 a memory device having a data bus containing a plurality of data bus bits;
 a logical array of processing elements each of which is coupled to a respective group of the data bus bits, each of the processing elements having an instruction input coupled to receive processing element instructions for controlling the operation of the processing elements, the processing elements in the array being logically arranged in a rectangular grid of logical rows and logical columns in which each processing element lies in only one logical row and one logical column, the processing elements in the array being divided into four sub-arrays each including the processing elements in a respective quartile of the logical array, the processing elements in each of the sub-arrays being physically positioned in a folded arrangement in which the processing elements in different logical rows are physically interleaved with each other and the processing elements in different logical columns are physically interleaved with each other;
 a system of conductors coupling the processing elements in each of the logical rows and columns to each other;
 an array control unit being operable to generate a sequence of array control unit instructions responsive to each of a plurality of array control unit commands applied to a command input of the array control unit;
 a memory device control unit coupled to the memory device, the memory device control unit being operable to generate and to couple respective sets of memory commands to the memory device responsive to each of a plurality of memory device control unit commands applied to a command input of the memory device control unit; and
 a command engine coupled to the array control unit and the memory device control unit, the command engine being operable to couple to the array control unit respective sets of the array control unit commands and to couple to the memory device control unit respective sets of the memory device control unit commands responsive to respective task commands applied to a task command input of the command engine.

2. The active memory device of claim 1 wherein the memory device comprises a dynamic random access memory device.

3. The active memory device of claim 1 wherein the processing elements in each logical column are separated from each other by one processing element.

4. The active memory device of claim 1 wherein the processing elements in each logical row are separated from each other by three processing elements.

5. The active memory device of claim 1 wherein each of the sub-arrays comprises 256 processing elements.

6. The active memory device of claim 1 wherein the logical array of processing elements comprises a logical upper edge and a logical lower edge, and wherein the processing elements in each of the sub-arrays are physically positioned so that the processing elements adjacent the logical upper edge are physically positioned adjacent the processing elements adjacent the logical lower edge.

7. The active memory device of claim 1 wherein the logical array is divided into logical upper and lower sections of processing elements separated from each other by a divide line, and wherein the processing elements in each of the sub-arrays are physically positioned so that the lowest processing elements in the logical upper section are adjacent the highest processing elements in the logical lower section on opposite sides of the divide line.

8. The active memory device of claim 1 wherein each sub-array is logically divided into logical upper and lower sections of processing elements, and wherein the processing elements in each of the sub-arrays are physically positioned so that the processing elements in the logical upper section are interleaved with the processing elements in the logical lower section.

9. The active memory device of claim 1, further comprising a plurality of row registers logically positioned along one edge of the logical array at the end of respective logical rows and a plurality of column registers logically positioned along an adjacent edge of the logical array at the end of respective logical columns.

10. The active memory device of claim 9 wherein the logical array of processing elements comprises a logical upper edge and a logical lower edge, and wherein the column registers are physically positioned so that they are physically adjacent the processing elements that are adjacent the logical upper edge and the logical lower edge of the logical array.

11. The active memory device of claim 10 wherein the column registers are physically positioned adjacent one physical edge of each sub-array.

12. The active memory device of claim 9 wherein the logical array of processing elements comprises a logical left edge and a logical right edge, and wherein the row registers are physically positioned so that they are physically adjacent the processing elements that are adjacent the logical left edge and the logical right edge of the logical array.

13. The active memory device of claim 12 wherein the row registers are physically positioned at the middle of each sub-array.

14. A computer system, comprising:
 a host processor having a processor bus;
 at least one input device coupled to the host processor through the processor bus;
 at least one output device coupled to the host processor through the processor bus;

at least one data storage device coupled to the host processor through the processor bus; and an active memory device, comprising:

a memory device having a data bus containing a plurality of data bus bits;

a logical array of processing elements each of which is coupled to a respective group of the data bus bits, each of the processing elements having an instruction input coupled to receive processing element instructions for controlling the operation of the processing elements, the processing elements in the array being logically arranged in a rectangular grid of logical rows and logical columns in which each processing element lies in only one logical row and one logical column, the processing elements in the array being divided into four sub-arrays each including the processing elements in a respective quartile of the logical array, the processing elements in each of the sub-arrays being physically positioned in a folded arrangement in which the processing elements in different logical rows are physically interleaved with each other and the processing elements in different logical columns are physically interleaved with each other;

a system of conductors coupling the processing elements in each of the logical rows and columns to each other;

an array control unit being operable to generate a sequence of array control unit instructions responsive to each of a plurality of array control unit commands applied to a command input of the array control unit;

a memory device control unit coupled to the memory device, the memory device control unit being operable to generate and to couple respective sets of memory commands to the memory device responsive to each of a plurality of memory device control unit commands applied to a command input of the memory device control unit; and a command engine coupled to the array control unit and the memory device control unit, the command engine being operable to couple to the array control unit respective sets of the array control unit commands and to couple to the memory device control unit respective sets of the memory device control unit commands responsive to respective task commands received from the host processor.

15. The active memory device of claim 14 wherein the memory device comprises a dynamic random access memory device.

16. The active memory device of claim 14 wherein the processing elements in each logical column are separated from each other by one processing element.

17. The active memory device of claim 14 wherein the processing elements in each logical row are separated from each other by three processing elements.

18. The active memory device of claim 14 wherein each of the sub-arrays comprises 256 processing elements.

19. The active memory device of claim 14 wherein the logical array of processing elements comprises a logical upper edge and a logical lower edge, and wherein the processing elements in each of the sub-arrays are physically positioned so that the processing elements adjacent the logical upper edge are physically positioned adjacent the processing elements adjacent the logical lower edge.

20. The active memory device of claim 14 wherein the logical array is divided into logical upper and lower sections of processing elements separated from each other by a divide line, and wherein the processing elements in each of the sub-arrays are physically positioned so that the lowest processing elements in the logical upper section are adjacent the highest processing elements in the logical lower section on opposite sides of the divide line.

21. The active memory device of claim 14 wherein each sub-array is logically divided into logical upper and lower sections of processing elements, and wherein the processing elements in each of the sub-arrays are physically positioned so that the processing elements in the logical upper section are interleaved with the processing elements in the logical lower section.

22. The active memory device of claim 14, further comprising a plurality of row registers logically positioned along one edge of the logical array at the end of respective logical rows and a plurality of column registers logically positioned along an adjacent edge of the logical array at the end of respective logical columns.

23. The active memory device of claim 22 wherein the logical array of processing elements comprises a logical upper edge and a logical lower edge, and wherein the column registers are physically positioned so that they are physically adjacent the processing elements that are adjacent the logical upper edge and the logical lower edge of the logical array.

24. The active memory device of claim 23 wherein the column registers are physically positioned adjacent one physical edge of each sub-array.

25. The active memory device of claim 22 wherein the logical array of processing elements comprises a logical left edge and a logical right edge, and wherein the row registers are physically positioned so that they are physically adjacent the processing elements that are adjacent the logical left edge and the logical right edge of the logical array.

26. The active memory device of claim 25 wherein the row registers are physically positioned at the middle of each sub-array.

* * * * *